United States Patent
Lee et al.

(10) Patent No.: US 10,510,663 B2
(45) Date of Patent: Dec. 17, 2019

(54) TRANSISTOR STRUCTURES HAVING ELECTRICALLY FLOATING METAL LAYER BETWEEN ACTIVE METAL LINES

(71) Applicant: GLOBALFOUNDRIES INC., Grand Cayman (KY)

(72) Inventors: Chien-Hsin Lee, Malta, NY (US); Haojun Zhang, Schenectady, NY (US); Mahadeva Iyer Natarajan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 15/474,354

(22) Filed: Mar. 30, 2017

(65) Prior Publication Data
US 2018/0286801 A1    Oct. 4, 2018

(51) Int. Cl.
*H01L 23/528* (2006.01)
*H01L 23/522* (2006.01)
*H01L 23/60* (2006.01)
*H01P 1/18* (2006.01)

(52) U.S. Cl.
CPC ........ *H01L 23/528* (2013.01); *H01L 23/5228* (2013.01); *H01L 23/60* (2013.01); *H01P 1/184* (2013.01)

(58) Field of Classification Search
CPC ..... H01L 23/528; H01L 23/5228; H01P 1/184
See application file for complete search history.

(56) References Cited

U.S. PATENT DOCUMENTS

| | | | |
|---|---|---|---|
| 4,891,686 A | 1/1990 | Krausse, III | |
| 8,552,414 B2* | 10/2013 | Wickramasinghe | .... H01L 21/84 257/4 |
| 2008/0204170 A1* | 8/2008 | Chang | ................. H01L 23/5223 333/209 |
| 2010/0225425 A1* | 9/2010 | Cho | ...................... H01P 1/2013 333/238 |
| 2011/0127483 A1* | 6/2011 | Sonehara | ........... G11C 13/0002 257/2 |
| 2012/0034774 A1 | 2/2012 | Anthony et al. | |
| 2012/0236628 A1* | 9/2012 | Ikeda | ................. G11C 13/0007 365/148 |
| 2013/0082802 A1 | 4/2013 | Elad et al. | |
| 2014/0117552 A1* | 5/2014 | Qian | ................. H01L 23/49827 257/762 |
| 2014/0353573 A1* | 12/2014 | Kalra | .................... H01L 45/146 257/5 |
| 2018/0076134 A1* | 3/2018 | Jing | ..................... H01L 23/5227 |
| 2018/0301189 A1* | 10/2018 | Hu | ..................... G11C 13/0002 |

OTHER PUBLICATIONS

Taiwanese Office Action dated Nov. 12, 2018 for related TW Application No. 106122236, 6 pages.
Taiwanese Notice of Allowance dated May 14, 2019 for related TW Application No. 106122236, 4 pages.

* cited by examiner

*Primary Examiner* — Michael Jung
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to transistor structures and methods of manufacture. The structure includes active metal lines separated by electrically floating metal layers which have a width less than a width of the active metal lines.

17 Claims, 6 Drawing Sheets

TRANSISTOR STRUCTURES HAVING ELECTRICALLY FLOATING METAL LAYER BETWEEN ACTIVE METAL LINES

FIELD OF THE INVENTION

The present disclosure generally relates to semiconductor structures and, more particularly, to transistor structures and methods of manufacture.

BACKGROUND

For power semiconductor devices (e.g., BJT, MOSFET, thyristor, IGBT, etc), the safe operating area (SOA) is defined as the voltage and current conditions over which the device can be expected to operate without self-damage. By way of example, the damage to the device can occur if $V_D$ exceeds the SOA boundary. By way of a more specific example, operating outside of the SOA boundary can be caused by large varying current components, which result in electromagnetic interactions causing damage to the device. Many factors can cause the device to operate outside of the safe operating area (SOA) boundary including, e.g., device dimensions, current, location of metal lines, etc. Moreover, abnormal SOA/resistor-like behavior can occur at a high $V_{Gin}$ for both RF and power transistors.

The skin effect and proximity effect are also known to effect device performance, e.g., for a device to perform outside of the SOA boundary. For example, skin effect is the tendency of an alternating electric current (AC) to become distributed within a conductor such that the current density is largest near the surface of the conductor, and decreases with greater depths in the conductor. The skin effect causes the effective resistance of the conductor to increase at higher frequencies where the skin depth is smaller, thus reducing the effective cross-section of the conductor. For current flowing in the same direction, the currents will crowd at the two edges; whereas, for current flowing in different directions, the currents will crowd at the regions facing each other.

On the other hand, the proximity effect in a conductor carrying alternating current results from currents flowing through one or more other nearby conductors. In the proximity effect, distribution of current within the first conductor will be constrained to smaller regions, resulting in current crowding. This crowding gives an increase in the effective resistance of the circuit, which increases with frequency.

SUMMARY

In an aspect of the disclosure a structure comprises: active metal lines separated by electrically floating metal layers which have a width less than a width of the active metal lines.

In an aspect of the disclosure a structure comprises: a first plurality of active metal lines in a first wiring plane; a second plurality of active metal lines in a second wiring plane; and floating metal layers located between the first plurality of active metal lines and the second plurality of active metal lines to prevent skin effects.

In an aspect of the disclosure a structure comprises: an upper level of active metal lines; a lower level of active metal lines transverse to the upper level; and a cage of floating metal layers surrounding the active metal lines in the upper level and the lower level and between the upper level and the lower level.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to transistor structures and methods of manufacture. In embodiments, the transistor structures perform within the safe operating performance boundaries, which advantageously prevent power MOS burnout from occurring during normal operation of the transistor structures. In addition, the transistor structures described herein prevent the safe operating area (SOA) boundary from varying in accordance with the dimensions of the transistor structures.

The transistor structures described herein are composed of floating metal layers which prevent undesired behavior caused by varying-current components which would otherwise result in electromagnetic interactions. For example, by using the floating metal layers in the devices described herein, the transistor structures will not exhibit effects caused by current crowding from the electromagnetic interactions of the neighboring metal lines, e.g., will prevent both skin effect and proximity effect issues.

In embodiments, the transistor structures described herein include several metal layers of certain width, e.g., less than or equal to a skin depth, which will separate active metal lines of the device. These active lines can be, e.g., metal layers for both the source and drain of the device. For example, the metal layers can be floating metal layers that separate the source and drain metal lines, thereby preventing the occurrence of the skin effect and proximity effect issues from occurring in the device. In more specific embodiments, the specific arrangements of various floating metal layers separating S/D metal layers can be transversely arranged with respect to each other.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask. The transistor structures described herein can be implemented by BEOL and to process of record CMOS processes, without addition processing and masking steps.

Figure 1A:
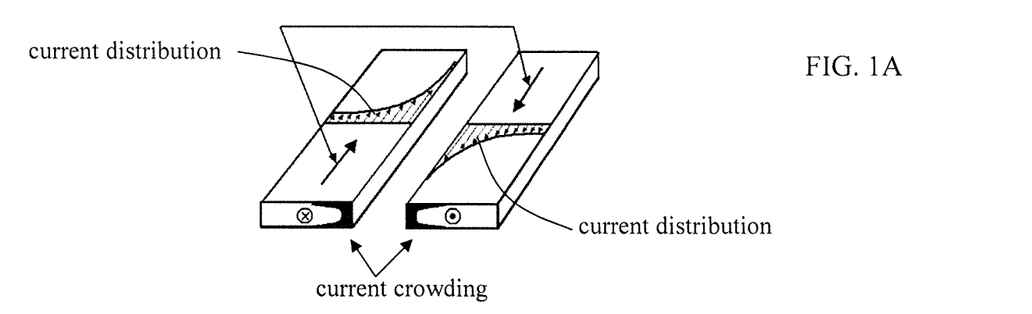
FIGS. 1A-1D show different arrangements of metal lines which exhibit skin effect and proximity effect.
Figure 1B:
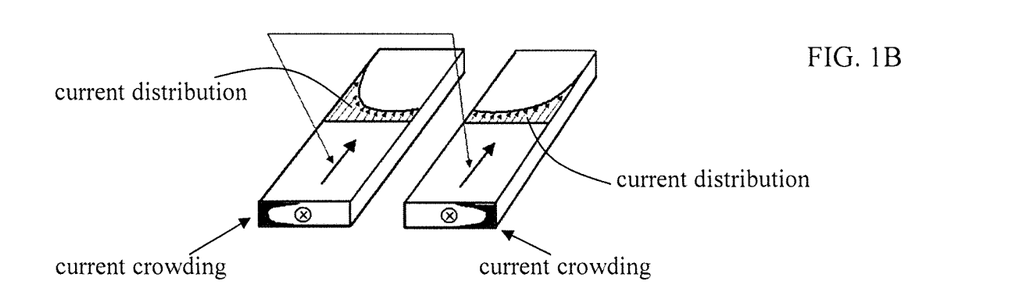
Figure 1C:
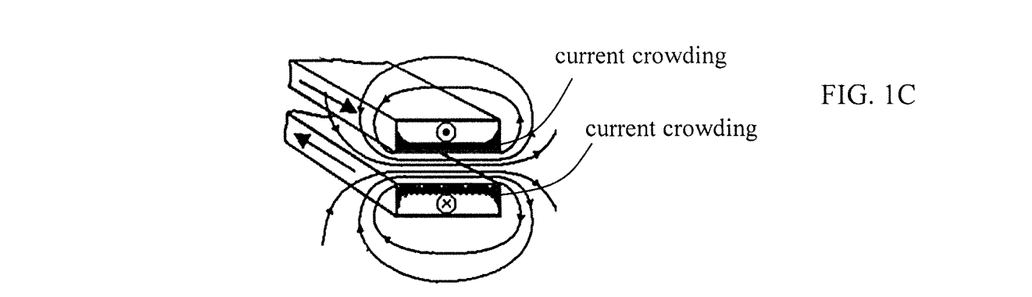
Figure 1D:
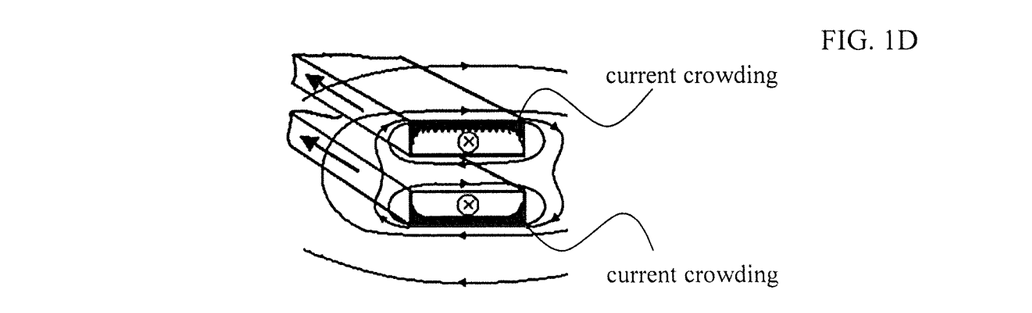
Figure 2A:
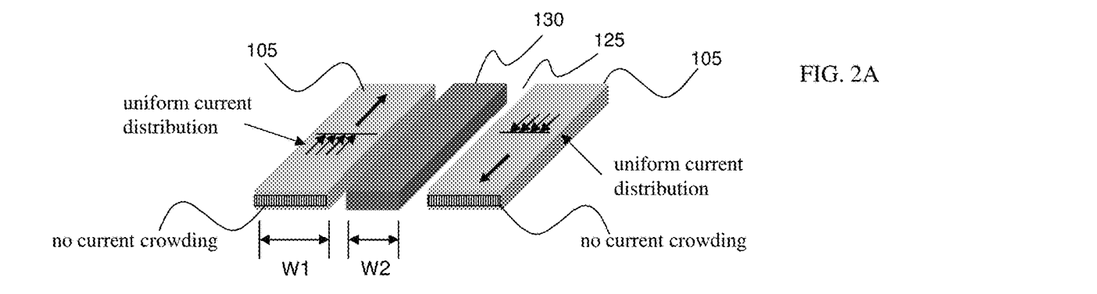
FIGS. 2A-2D show floating metal layers separating metal lines, amongst other features, and respective fabrication processes in accordance with aspects of the present disclosure.
Figure 2B:
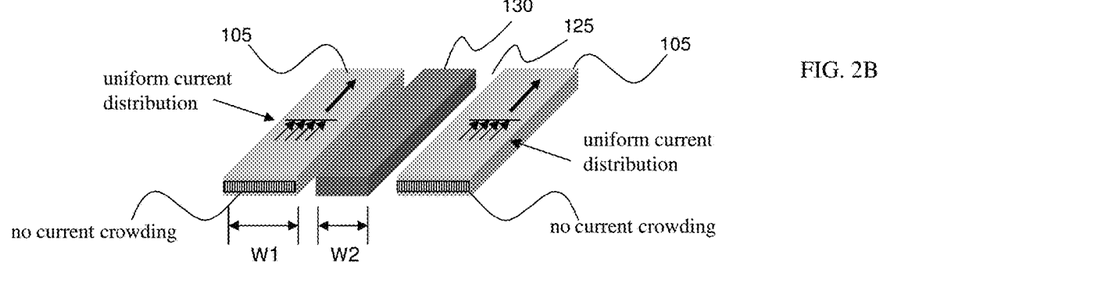
Figure 2C:
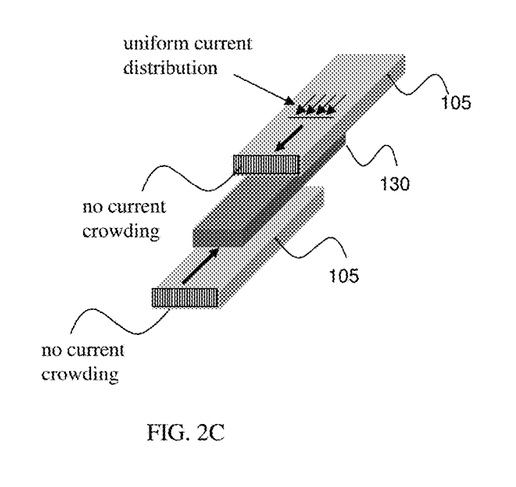
Figure 2D:
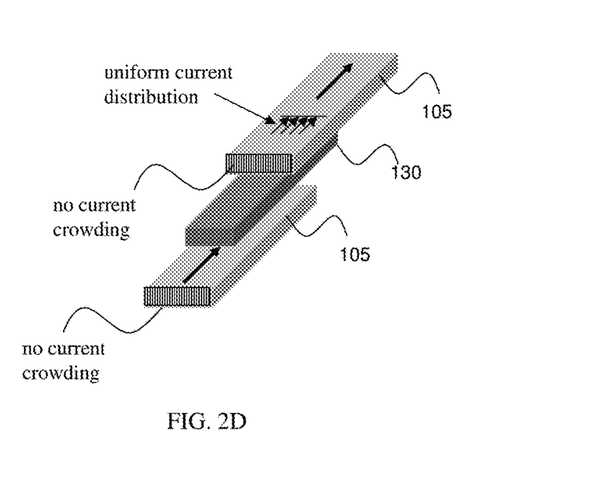

FIGS. 1A-1D show different arrangements of metal lines which exhibit skin effect and proximity effects. These metal lines can be implemented in RF and power transistor devices, amongst other examples. For example, the devices can be implemented in a power management integrated circuit (PMIC) chip. In FIG. 1A, the metal lines are arranged in parallel, side-by-side, with current flowing in an opposite direction. In this example, the current crowding and increased current distribution are shown to be in facing edges. In contrast, in FIG. 1B, the metal lines are arranged in parallel, side-by-side, having current flowing in the same direction. In this example, the current crowding and increased current distribution are shown to be in opposing edges. In FIG. 1C, the metal lines are arranged parallel, in a stacked configuration, with current flowing in an opposite direction. In this example, the current crowding and increased current distribution are shown to be in facing edges. In contrast, in FIG. 1D, the metal lines which are arranged in parallel, in a stacked configuration, have current flowing in the same direction. In this example, the current crowding and increased current distribution are shown to be in opposing edges.

In comparison, FIGS. 2A-2D show floating metal layers separating metal lines, amongst other features, and respective fabrication processes in accordance with aspects of the present disclosure. In embodiments, the electrically floating metal layers, i.e., floating metal layers 130, can be provided between (e.g., separate) source and drain metal lines, represented at reference numeral 105. More specifically, active metal lines are source lines and drain lines 105 of an active device. As in each of the embodiments, the floating metal layers 130 will reduce magnetic fields about the metal lines 105, as well as reduce current crowding, e.g., no current crowding. The reduction in current crowding, in turn, will increase current distribution, effectively increasing device performance and maintaining the device within SOA boundaries.

As shown in FIGS. 2A-2D, the configuration of the source and drain metal lines 105 is similar to that shown in FIGS. 1A-1D, respectively, e.g., in a parallel or stacked, side-by-side arrangement. Moreover, similar to FIGS. 1A-1D, the current flowing in the source and drain metal lines 105 are either in the same direction or a different direction. However, in the embodiments shown in FIGS. 2A-2D, issues related to the skin effect and proximity effect are prevented between adjacent lines of the active metal lines, i.e., the source and drain metal lines 105, by the use and location of the floating metal layers 130 as described herein. That is, by using the floating metal layers 130 the current density will be more uniform within the metal lines 105, allowing the device to operate within the SOA boundary. This is illustrated by the uniform current distribution in the source and drain metal lines 105 as shown in FIGS. 2A-2D.

In embodiments, the floating metal layers 130 can be made from a number of suitable materials. For example, the electrically floating metal layers, i.e., the floating metal layers 130, can be composed of different conductive materials, e.g., aluminum, copper or tungsten materials, amongst other examples. In embodiments, such as the embodiments illustrated in FIGS. 2A and 2B, the floating metal layers 130 can be separated from the source and drain metal lines 105 by an insulator material 125, e.g., $SiO_2$. The electrically floating metal layers, i.e., floating metal layers 130, have a width ($W_2$) which is preferably less than a width ($W_1$) of each active metal line 105. In a more specific example, the width $W_2$ of the floating metal layers 130 is less than or equal to ($\leq$) a skin depth ($\delta$) of each metal line 105. The skin depth $\delta$ is given by the equation:

$$\delta = \frac{1}{\sqrt{\pi f \mu \sigma}} \quad (1)$$

where $\delta$=skin depth, f=frequency, $\mu$=permeability and $\sigma$=conductivity. For f=1 GHz, $\delta$=2.8 µm.

As an example, if $W_1$ of the metal line 105 is equal to 6 µm and the space between the adjacent metal lines 105 is equal to 3 µm, the floating metal layers 130, e.g., the dummy metal, can fit between the spacing of the metal lines 105 since $W_2$ can be less than or equal to 2.8 µm. In embodiments, $W_2$ can be a width in a range of about 1-2 µm; although other dimensions are also contemplated herein. It is noted that generally the width $W_1$ is greater than (>) $\delta$. The floating metal layer 130 can reduce an applied field (B) more than without the floating metal layer 130 to prevent interference from each metal line 105.

Figure 3:
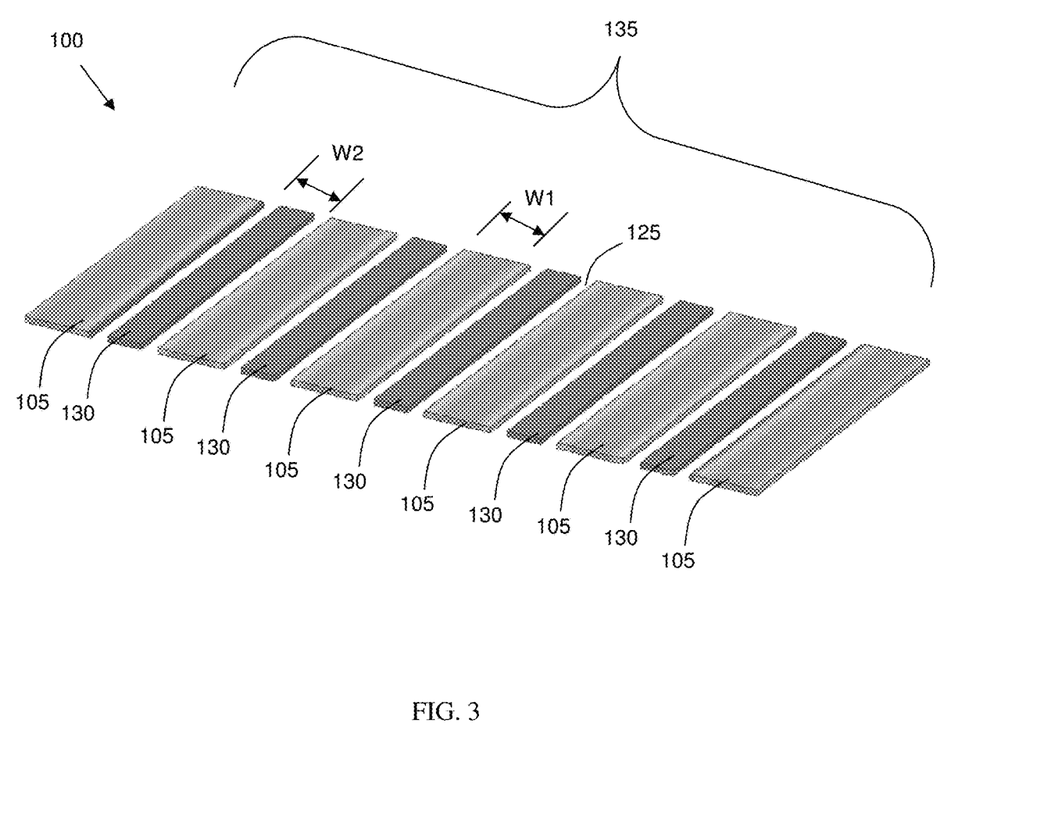
FIG. 3 shows floating metal layers separating metal lines in a single plane, amongst other features, and respective fabrication processes in accordance with aspects of the present disclosure.

FIG. 3 shows a partial cut-away of a device 100 with metal lines 105 and floating metal layers 130 arranged in an alternating fashion, in a single wiring plane, e.g., same metal layer 135. As previously described, the metal lines 105 and the floating metal layers 130 can be separated by an insulator material 125. In embodiments, the metal layer 135 can serve as a plane for either a source region or a drain region of the device. Again, the width $W_1$ of each metal line 105 is shown to be greater than the width $W_2$ of each the floating metal layers 130.

Figure 4:
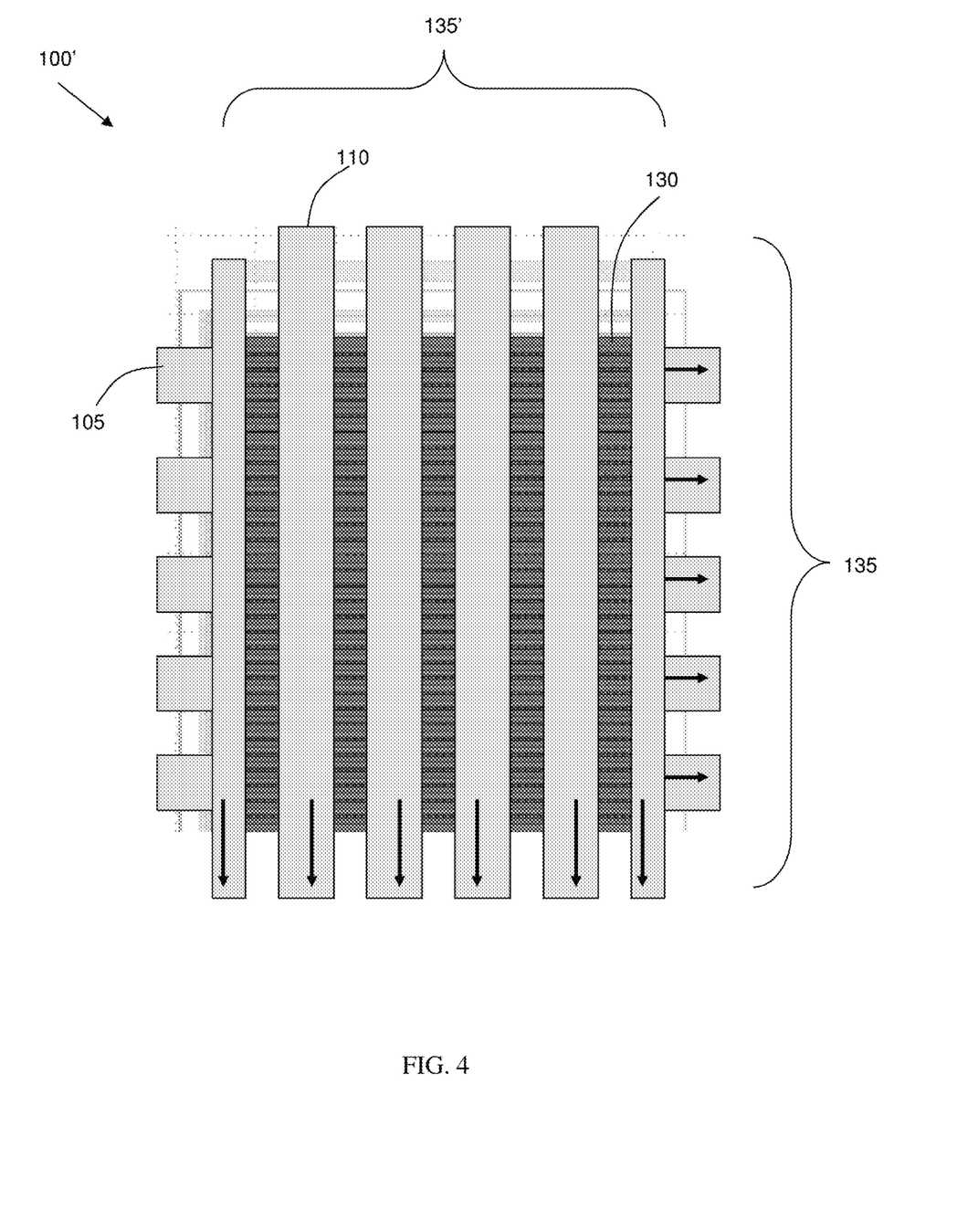
FIG. 4 shows floating metal layers separating metal lines in different planes, amongst other features, and respective fabrication processes in accordance with aspects of the present disclosure.

FIG. 4 illustrates a device 100' with the transversely arranged plurality of active metal lines 105, 110 in separate wiring planes, e.g., different metal layers 135, 135'. In embodiments, the plurality of metal lines 105 can be metal lines connected to the source; whereas, the plurality of metal lines 110 can be metal lines connected to the drain. In alternative embodiments, the plurality of metal lines 105 can be metal lines connected to the drain; whereas, the plurality of metal lines 110 can be metal lines connected to the source. Alternatively, the metal lines 105 can be any active metal lines with a current flowing therethrough. In this representation, the different metal layers 135, 135' are stacked with respect to each other, with the metal lines 105, 110 separated by the floating metal layer 130 by an insulator material, such as insulator material 125. In embodiments, the floating metal layer 130 can also separate the individual metal lines 105, 110 in the same plane, resulting in a faraday cage-like structure (see, e.g., FIG. 5). The location of the floating metal layer 130 between the metal layers 135, 135', in addition to between the metal lines 105, 110, will prevent the proximity and skin effects from occurring in the device. In addition, the transverse nature of the metal layers 135, 135' can also prevent proximity effects.

Figure 5:
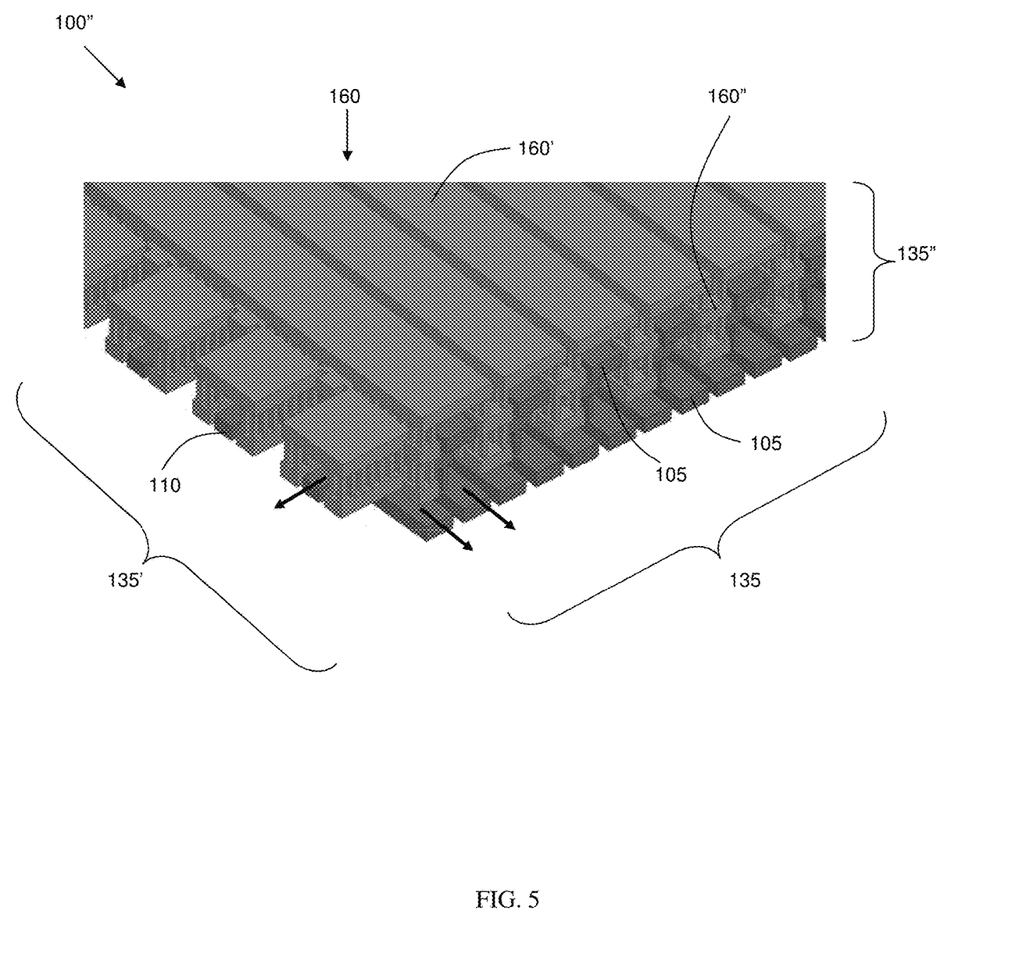
FIG. 5 shows a floating cage structure separating active lines, amongst other features, and respective fabrication processes in accordance with aspects of the present disclosure.

FIG. 5 shows floating metal layers forming a cage structure, amongst other features, and respective fabrication processes in accordance with aspects of the present disclosure. More specifically, the structure 100" shown in FIG. 5 includes a plurality of metal lines 105, 110 in different planes 135, 135', and 135". In this representation, the metal lines 105, 110 can be source and drain metal lines or any active metal lines as already described herein, separated by floating metal lines arranged in a cage-like structure, i.e., cage configuration 160. As shown in FIG. 5, the cage configuration 160 will separate the active metal lines 105, 110 in the same plane and separate planes, eliminating both the skin effects and proximity effects. Further, active metal lines 105 are in wiring plane 135", represented as an upper level of active metal lines, while active metal lines 110 are in wiring plane 135' represented as a lower level of active metal lines transverse to the upper level. As shown in FIG. 5, the cage configuration 160 of floating metals surrounds the active metal lines 105 in the upper level and the active metal lines 110 in the lower level and between the upper level and the lower level. This cage configuration 160 prevents skin effects and proximity effects between upper lines 105 and lower lines 110 which are in a stacked configuration, and can also prevent skin effects and proximity effects between adjacent metal lines of the active metal lines 105, 110 in a same wiring plane.

Still referring to FIG. 5, in embodiments, the cage configuration 160 includes electrically floating metal layers, i.e., metal layers 160', positioned below and above the metal lines 105, 110, in addition to metal vias 160" positioned on sides of the metal lines 105, 110, which can be connected to the metal layers 160'. As in any of the embodiments, the metal layer 160' can be planar metal layers with a thickness about 1 micron to about 2 microns (although other dimensions are also contemplated herein, based on the dimensions of the metal lines 105, 110). In more specific embodiments, the metal layers (e.g., floating metal layers) can be composed of several small width metals less than or equal to the skin depth of the metal lines 105, 110, in order to provide the skin effect from occurring in the wider metal lines 105, 110. More specifically, the width of the metal layers 160' and/or the width of the metal vias 160" can be less than or equal to a skin depth of each active metal out of the active metal lines 105, 110.

Still referring to FIG. 5, the metal lines 105, 110 can be designed in accordance with engineered design rules and electrical rule guidance to force the different metal layers into different directions, thereby preventing the proximity effect. For example, the metal lines 105, 110 can be arranged in a transverse configuration with respect to each other. More specifically, the active metal lines 105, 110 are metal lines in different planes, such as planes 135, 135', and 135", transverse to each other. In addition, the metal lines 105, 110 in the same plane can be separated with the floating metal, e.g., metal layers 160' and/or metal vias 160", to prevent the proximity effect caused by adjacent metal lines. Additionally, in further embodiments, the metal layers 160' and the metal vias 160" can be between the active metal lines on different wiring planes, i.e., the metal lines 105, 110.

Accordingly, the cage configuration 160 prevents both the skin effects and the proximity effects since the electrically floating metal layers. i.e., metal layers 160' and the metal vias 160" are arranged in a cage configuration surrounding the active metal lines 105, 110 in the different wiring planes 135, 135' and 135". More specifically, in embodiments, floating metal layers such as the metal vias 160" are between the first plurality of active metal lines 105 in a first wiring plane 135 and between the second plurality of active metal lines 110 in the second wiring plane 135', and metal layers 160' are between the first plurality of active metal lines 105 and the second plurality of active metal lines 110. That is, the cage configuration 160 includes metal vias 160" which surround the active metal lines 105 in the upper level and the active metal lines 110 in the lower level in combination with the floating metal layers 160' between the active metal lines 105, 110 in the upper level and the lower level. The metal layers 160' and metal vias 160" can be fabricated using conventional lithography, etching (reactive ion etching (RIE)) and deposition processes, e.g., chemical vapor deposition processes, followed by removal of any residual materials by a chemical mechanical polishing (CMP) process.

Figure 6:
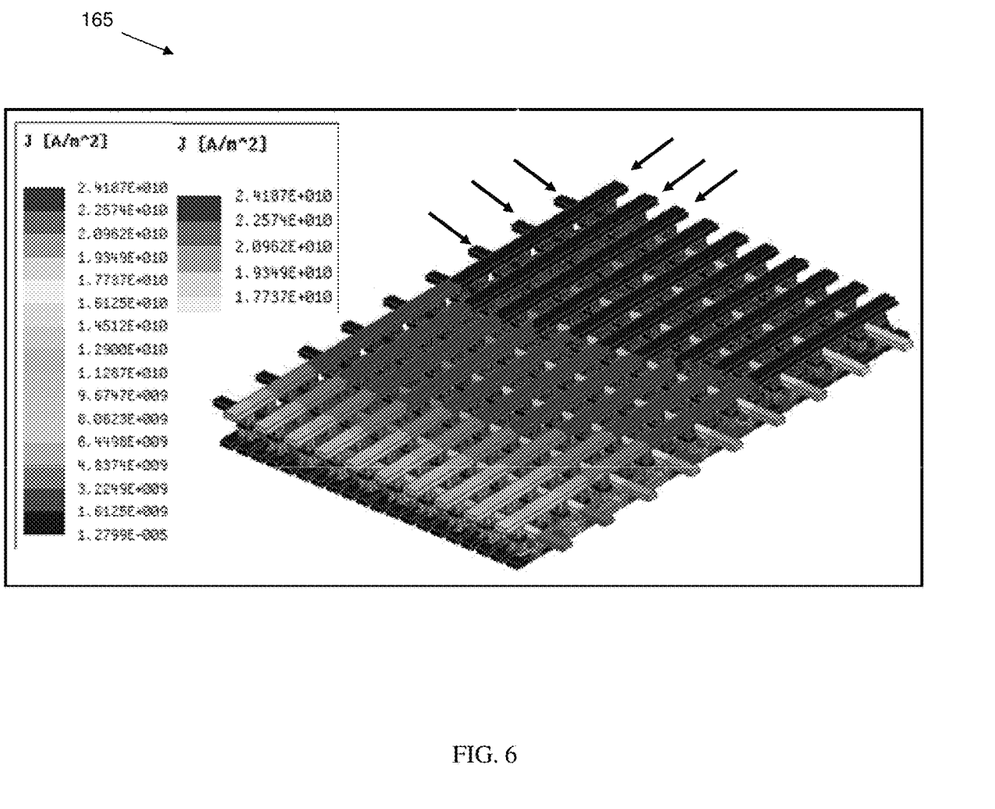
FIG. 6 shows a simulation of the structure of FIG. 5.

FIG. 6 illustrates a simulation 165 of the structure of FIG. 5 with the upper floating layer removed to show visually the current distribution of the metal lines. Specifically, FIG. 6 illustrates the decrease in current density J in A/m$^2$ that occurs from the structures, e.g., structure 100" described herein. As shown in FIG. 6, a maximum current density of conventional devices is nearly three times the current density of the structures described herein. Further, the currents flowing through the structures described herein are distributed more uniformly (as shown by uniform shading of the wiring lines) compared to conventional structures. This is due to the lack of current crowding at the edges of the wiring lines as described herein, in comparison to the current crowding that occurs in wiring lines of conventional structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising active metal lines arranged side-by-side and separated from electrically floating metal layers by an insulator material, the electrically floating metal layers alternating in the single wiring plane between the active metal lines, each of the electrically floating metal layers has a width less than a width of each of the active metal lines, wherein the active metal lines are source lines and drain lines of an active device.

2. The structure of claim 1, wherein the active metal lines comprise metal lines in different planes, transverse to each other, and the electrically floating metal layers are positioned between the different planes.

3. The structure of claim 1, wherein the electrically floating metal layers are composed of tungsten, aluminum or copper material.

4. The structure of claim 1, wherein the width of each of the electrically floating metal layers is less than or equal to a skin depth of each of the active metal lines.

5. The structure of claim 1, wherein the electrically floating metal layers are between adjacent metal lines of the active metal lines arranged side-by-side.

6. The structure of claim 1, wherein the electrically floating metal layers are between the active metal lines on different wiring planes.

7. The structure of claim 1, wherein the electrically floating metal layers are located to prevent skin effects and proximity effects between adjacent lines of the active metal lines.

8. The structure of claim 7, wherein the electrically floating metal layers are arranged in an alternating fashion.

9. The structure of claim 8, wherein the electrically floating metal layers fit between a spacing of the active metal lines arranged side-by-side.

10. The structure of claim 9, wherein the insulator material is positioned within the spacing.

11. The structure of claim 10, wherein the width of each of the electrically floating metal layers is less than a width of each metal line of the active metal lines.

12. The structure of claim 11, wherein the skin depth further comprises a frequency of an alternating current flowing through the active metal lines.

13. A structure, comprising:
a first plurality of active metal lines in a first wiring plane;
a second plurality of active metal lines in a second wiring plane in a different direction than the first wiring plane;
floating metal layers located between and extending across the first plurality of active metal lines and the second plurality of active metal lines to prevent skin effects; and
a dielectric material which separates the floating metal layer from the first plurality of active metal lines and the second plurality of active metal lines, wherein the first plurality of active metal lines and the second plurality of active metal lines are source lines and drain lines of an active device.

14. The structure of claim 13, wherein the first wiring plane is transverse to the second wiring plane.

15. The structure of claim 13, wherein a width of each of the active metal lines in the first plurality of active metal lines is greater than or equal to a skin depth of the first plurality of active metal lines.

16. The structure of claim 15, wherein the floating metal layers comprise metal vias.

17. The structure of claim 16, wherein the width of each metal line in the first plurality of active metal lines is greater than a skin depth of the first plurality of active metal lines, the skin depth comprising a relationship between a permeability and a conductivity of the active metal lines and a frequency of a current flowing through the first plurality of active metal lines.

* * * * *